(12) United States Patent
Otsubo et al.

(10) Patent No.: US 7,595,508 B2
(45) Date of Patent: Sep. 29, 2009

(54) OPTICAL SEMICONDUCTOR DEVICE AND METHOD FOR FABRICATING THE SAME

(75) Inventors: Koji Otsubo, Kawasaki (JP); Yoshiaki Nakata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/857,920

(22) Filed: Jun. 2, 2004

(65) Prior Publication Data
US 2005/0045868 A1 Mar. 3, 2005

(30) Foreign Application Priority Data
Aug. 26, 2003 (JP) ............................. 2003-301292

(51) Int. Cl.
*H01L 33/00* (2006.01)
(52) U.S. Cl. .................. 257/79; 257/14; 257/E29.07; 257/E31.033; 257/E33.008; 257/E33.012
(58) Field of Classification Search .................. 257/14, 257/17, 21, 90, 94, 190, 13, 79, 103, E29.07, 257/E31.033, E33.008, E33.012
See application file for complete search history.

(56) References Cited

U.S. PATENT DOCUMENTS

| | | | |
|---|---|---|---|
| 5,068,867 A | * | 11/1991 | Hasenberg et al. ..... 372/45.012 |
| 6,239,449 B1 | * | 5/2001 | Fafard et al. ................. 257/17 |
| 6,590,233 B2 | * | 7/2003 | Sugawara ..................... 257/90 |
| 6,898,224 B2 | * | 5/2005 | Yokozeki et al. ......... 372/49.01 |
| 2002/0013042 A1 | * | 1/2002 | Morkoc ....................... 438/604 |

OTHER PUBLICATIONS

Tomoyuki Akiyama et al., "Pattern-effect-free-semiconductor optical amplifier achieved using quantum dots", Electronics Letters, vol. 38, No. 19, pp. 1139-1140. Sep. 12, 2002.
Tomoyuki Akiyama et al., "Symmetric highly efficient )0~dB) wavelength conversion based on four-wave mixing in quantum dot optical amplifiers", IEEE Photonics Technology Letters, vol. 14, No. 8, pp. 1139-1141. Aug. 2002.

* cited by examiner

*Primary Examiner*—Quoc D Hoang
(74) *Attorney, Agent, or Firm*—Kratz, Quintos & Hanson, LLP

(57) ABSTRACT

The optical semiconductor device comprises an active layer including a plurality of quantum dot stacks 18, 22, 26 each of which is formed of a plurality of quantum dot layers 14 and a plurality of first layers 16 alternately stacked, and a plurality of second barrier layers 20, 24 thicker than the first barrier layers 16 stacked alternately with the quantum dot stacks 18, 22, 26. Thus, the quantum dot layers can be stacked with the generation of dislocations due to lattice mismatching between the substrate and the quantum dots suppressed. A number of quantum dot layers can be stacked with a desired light confinement coefficient ensured. The optical semiconductor device can have the characteristics easily improved.

10 Claims, 9 Drawing Sheets

OPTICAL SEMICONDUCTOR DEVICE AND METHOD FOR FABRICATING THE SAME

CROSS-REFERENCE TO RELATED APPLICATIONS

This application is based upon and claims the benefit of priority from the prior Japanese Patent Application No. 2003-301292, filed on Aug. 26, 2003, the entire contents of which are incorporated herein by reference.

BACKGROUND OF THE INVENTION

The present invention relates to an optical semiconductor device and a method for fabricating the same, more specifically an optical semiconductor device including an active layer of quantum dot layers stacked one on another and a method for fabricating the optical semiconductor device.

As the optical fiber communication is more sped up and has larger capacities, the all-optical signal processing, such as 1R (regeneration), 2R (regeneration, reshaping) and 3R (regeneration, reshaping, retiming), which does not convert optical signals to electrical signals at the transit points of a network is required. Wavelength switches which are operative at ultra-high speed are required so as to realize free connections among sub-networks without the collision between wavelength bands (channels) used in a photonic network.

As a device for the all-optical signal processing and the wavelength switch, SOAs (Semiconductor Optical Amplifiers) are noted, and various studies are being made. SOAs are used not only as a device for amplifying light, but also as a wavelength switching device utilizing the nonlinear effect, i.e., an XGM (Cross Gain Modulation) device and an FWM (Four-wave Mixing) device.

Presently, SOAs having the bulk active layer or the quantum well active layer are produced but are limited in the high bit-rate all-optical signal processing ability. One cause for this is the pattern effect in the uses as amplifying devices and the wavelength switching devices using XGM. That is, when SOAs having the bulk active layer or the quantum well active layer are used near the gain saturation region of outputs, the gain recovery cannot follow bit rates, and the output pulse waveforms are disturbed. The wavelength conversion by FWMs does not have sufficient conversion efficiency, and the wavelength becomes unsymmetrical between positive detuning and negative detuning. A converted wavelength range where the S/N ratio is sufficient is accordingly limited. The SOA having quantum well active layers is described in, e.g., Reference 1 (Japanese published unexamined patent application No. 2003-017812).

To solve this problem it is proposed to use quantum dots in the active layer, and active studies for realizing the device are being made. Quantum dots are so quick to recover gains in comparison with bulks and quantum wells that the pattern effect never takes place even when used in a gain saturation region. The wavelength conversion by FWM using quantum dot SOAs may not depend on conversion directions. What has been described above has been empirically proved. SOAs using quantum dots are described in, e.g., Reference 2 (Tomoyuki Akiyama et al., "Pattern-effect-free semiconductor optical amplifier achieved using quantum dots", Electronics Letters, Sep. 12, 2002, Vol. 38, No. 19, pp. 1139-1140) and Reference 3 (Tomoyuki Akiyama et al., "Symmetric highly efficient (~0 dB) wavelength conversion based on four-wave mixing in quantum dot optical amplifiers", IEEE Photonics Technology Letters, Aug. 8, 2002, Vol. 14, No. 8, pp. 1139-1141).

Then, the conventional optical semiconductor device using quantum dots will be explained with reference to FIG. 9. FIG. 9 is a diagrammatic sectional view of the conventional optical semiconductor device, which shows the structure thereof.

An SCH (Separate Confinement Hetero-structure) layer 102 is formed on a semiconductor substrate 100. An active layer 104 formed of a stack of quantum dot layers 106 and barrier layers 108 repeatedly stacked the latter on the former is formed on the SCH layer 102. An SCH layer 110 is formed on the active layer 104. A clad layer 112 and a contact layer 114 are formed on the SCH layer 110. The clad layer 112 and the contact layer 114 are patterned in a mesa-configuration. A p-side electrode 118 is formed on the contact layer 114, which is on the top of the mesa, with an insulating film 116 formed therebetween. An n-side electrode 120 is formed on the backside of the substrate 100.

Thus, the optical semiconductor device having an active layer having a stack of a plurality of quantum dot layers is constituted.

SUMMARY OF THE INVENTION

In the optical semiconductor device using a quantum dot active layer, to stack a plurality of quantum dot layers and make the light confinement coefficient large, it is preferable to stack the quantum dot layers near each other at a small inter-layer pitch (about 5-20 nm) which does not allow the quantum dot layers to mutually react with each other.

However, in the quantum dots repeatedly stacked at such inter-layer pitch, dislocations take place due to lattice mismatching and increase the loss of the SOA. Accordingly, in the conventional optical semiconductor device, a layer number of the quantum dots that can be stacked is about 3 layers at most, which makes it impossible to make the light confinement coefficient sufficient.

An object of the present invention is to provide a optical semiconductor device having an active layer having a stack of quantum dot layers and a method for fabricating the optical semiconductor device, more specifically a optical semiconductor device whose layer number of quantum dot layers can be easily increased and which can have a large light confinement coefficient.

According to one aspect of the present invention, there is provided an optical semiconductor device comprising: a first clad layer of a first conduction type; an active layer formed over the first clad layer, including a plurality of quantum dot stacks each of which is formed of a plurality of quantum dot layers and a plurality of first barrier layers alternately stacked, and a plurality of second barrier layers thicker than the first barrier layers stacked alternately with the quantum dot stacks; and a second clad layer of a second conduction-type formed over the active layer.

According to another aspect of the present invention, there is provided an optical semiconductor device comprising: a first clad layer of a first conduction type; an active layer formed over the first clad layer, including a plurality of quantum wire stacks each of which is formed of a plurality of quantum wires and a plurality of first barrier layers alternately stacked, and a plurality of second barrier layers thicker than the first barrier layers stacked alternately with the quantum wire stacks; and a second clad layer of a second conduction-type formed over the active layer.

According to further another aspect of the present invention, there is provided an optical semiconductor device comprising: a first clad layer of a first conduction type; an active layer formed over the first clad layer, including a plurality of quantum well stacks each of which is formed of a plurality of quantum well layers and a plurality of first barrier layers alternately stacked, and a plurality of second barrier layers thicker than the first barrier layers stacked alternately with the quantum well stacks; and a second clad layer of a second conduction-type formed over the active layer.

According to further another aspect of the present invention, there is provided a method for fabricating an optical semiconductor device comprising the steps of: forming over a first clad layer of a first conduction type an active layer including a plurality of quantum dot stacks each of which is formed of a plurality of quantum dot layers and a plurality of first barrier layers alternately stacked, and a plurality of second barrier layers thicker than the first barrier layers stacked alternately with the quantum dot stacks; and forming a second clad layer of a second conduction type over the active layer.

According to the present invention, in the optical semiconductor device including an active layer having a stack of quantum dot layers, the quantum dot layers can be stacked one on another with the generation of dislocations due to lattice mismatching between the substrate and the quantum dots suppressed, whereby losses of the optical semiconductor device due to the dislocations can be prevented. The quantum dot layers can be stacked in a number of layers with a prescribed light confinement coefficient ensured, whereby the optical semiconductor device can have easily improved characteristics.

DETAILED DESCRIPTION OF THE INVENTION

The optical semiconductor device and the method for fabricating the same according to one embodiment of the present invention will be explained with reference to FIGS. 1 to 7.

Figure 1:
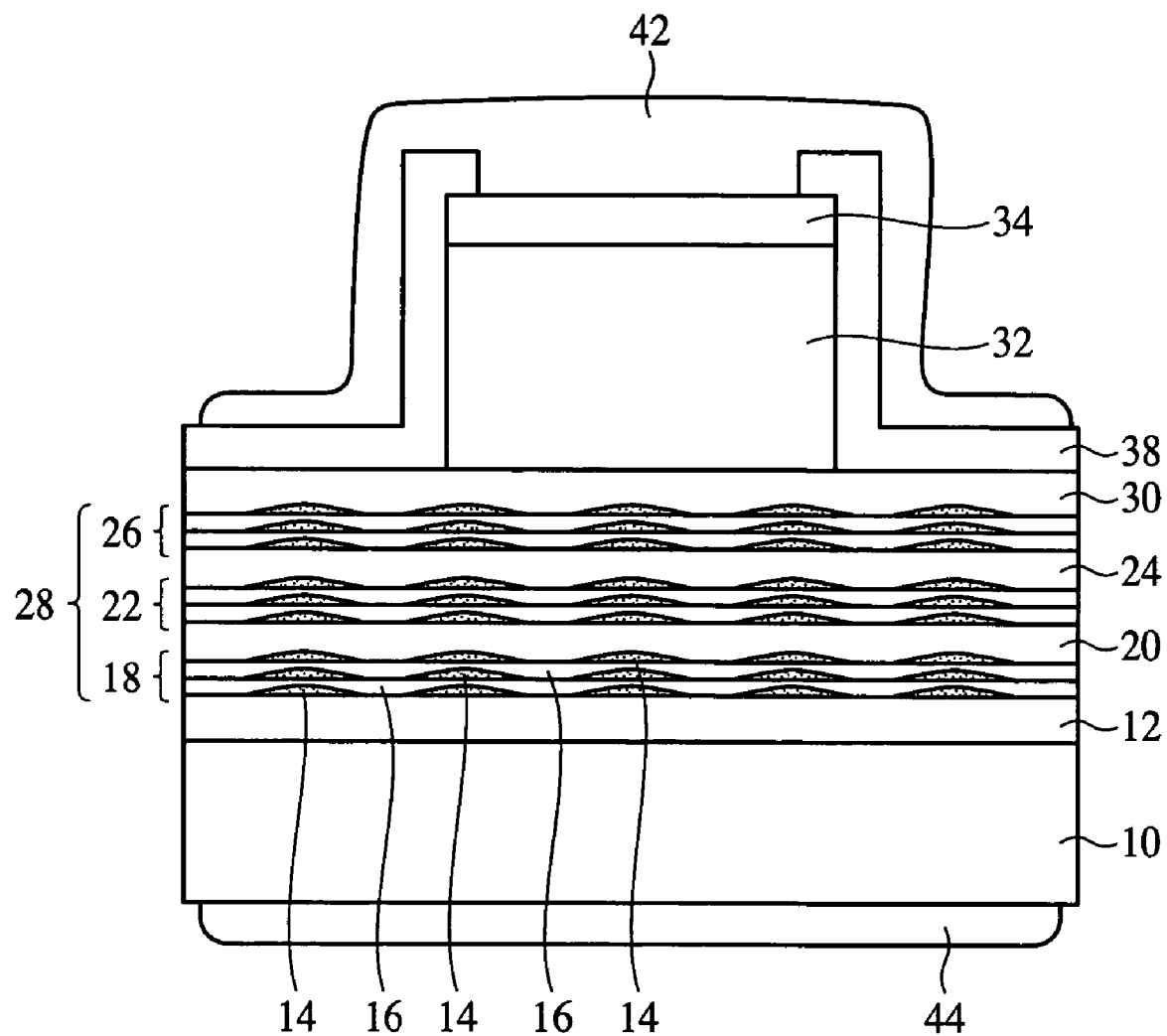
FIG. 1 is a diagrammatic sectional view of the optical semiconductor device according to one embodiment of the present invention, which shows a structure thereof.
Figure 2:
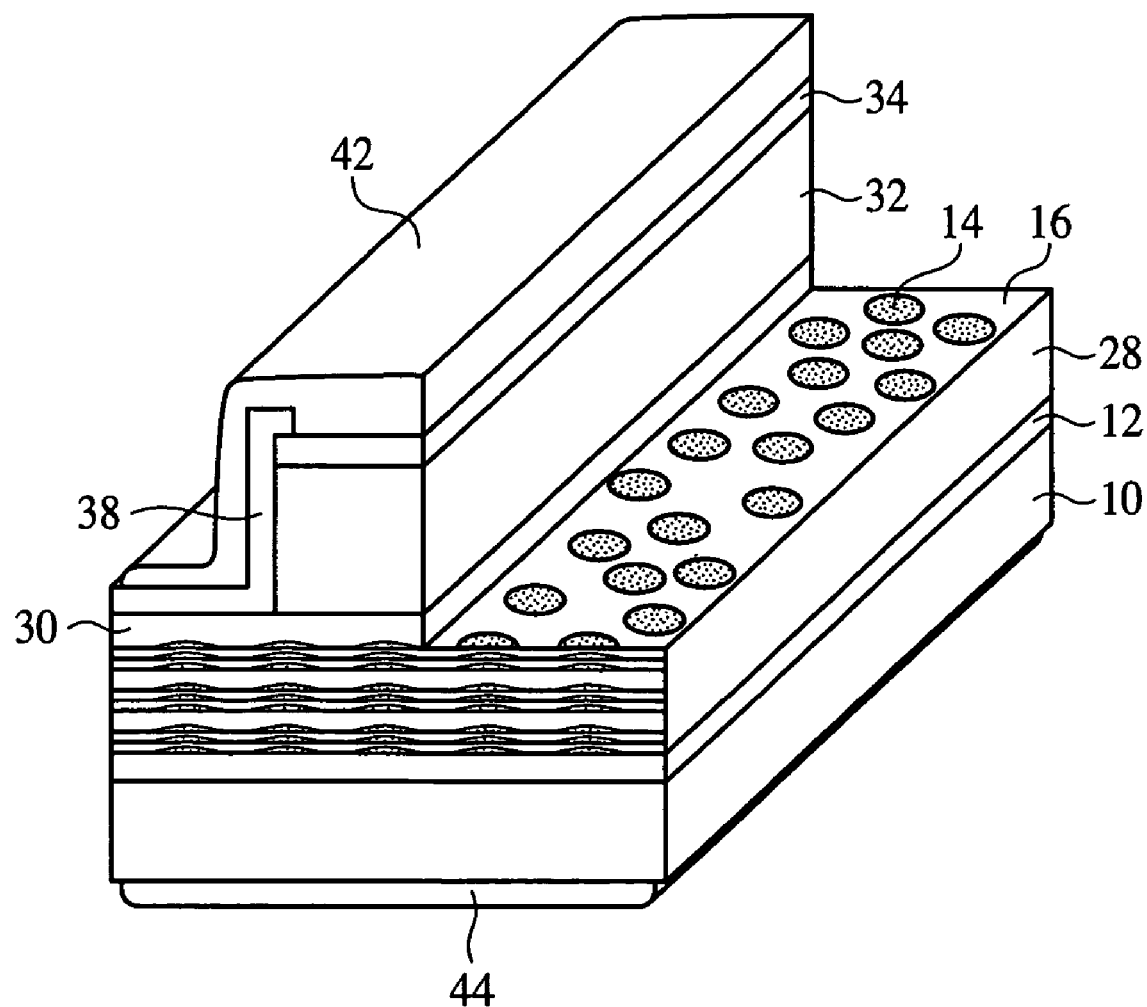
FIG. 2 is a perspective view of the optical semiconductor device according to the embodiment of the present invention, which shows the structure thereof.
Figure 3:
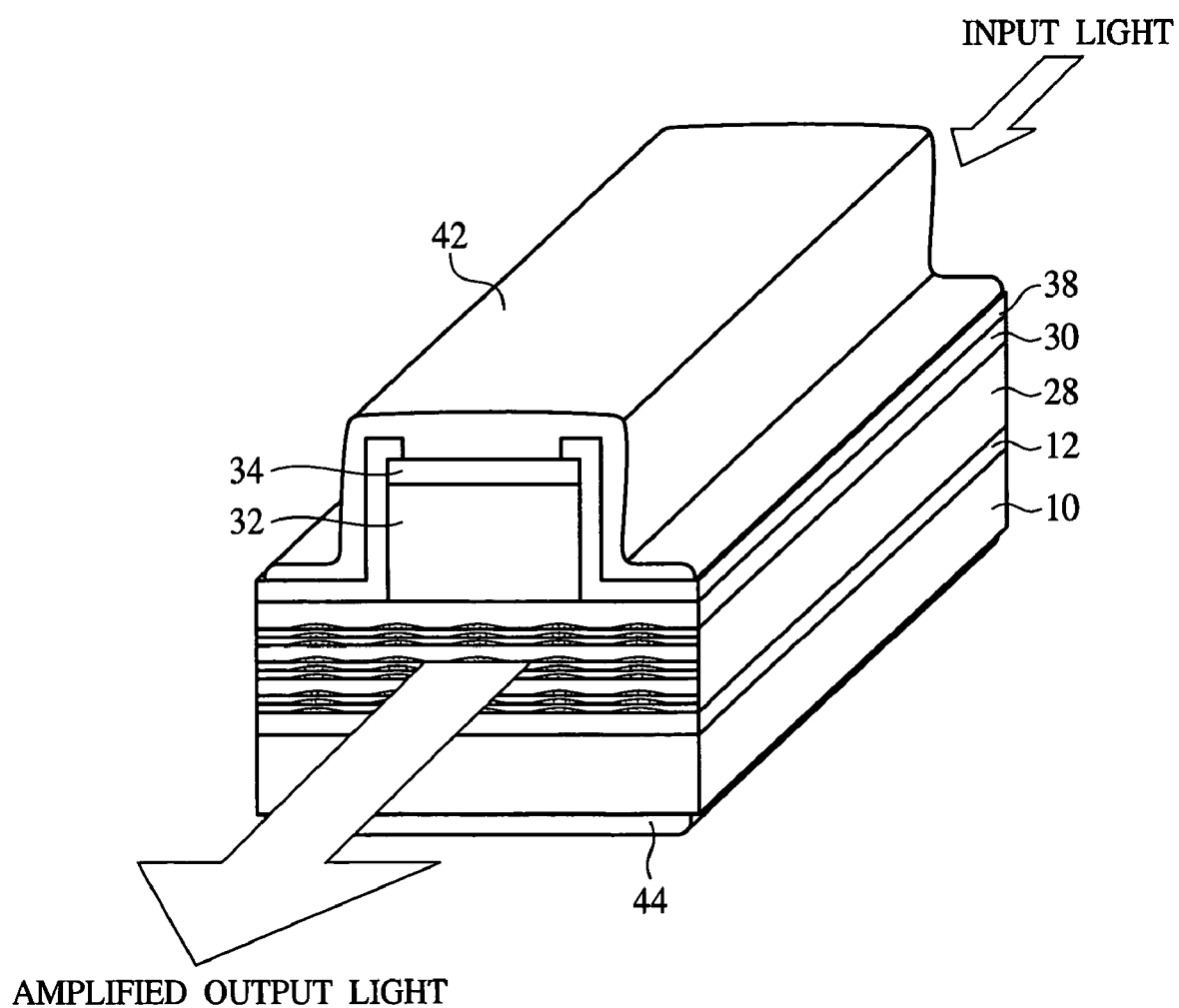
FIG. 3 is a perspective view of the first example of the optical semiconductor device according to the embodiment of the present invention.
Figure 4:
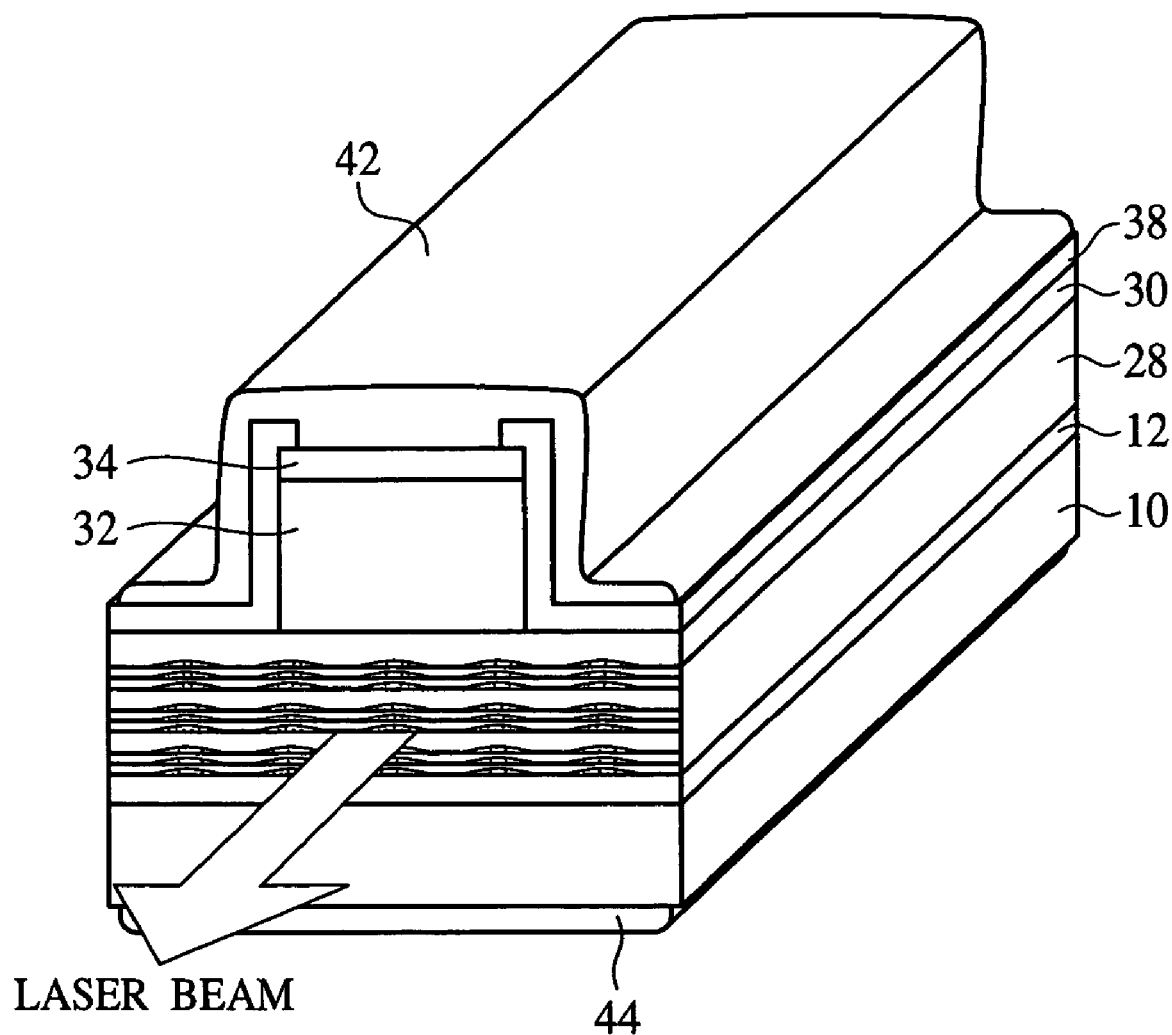
FIG. 4 is a perspective view of the second example of the optical semiconductor device according to the embodiment of the present invention.

FIG. 1 is a diagrammatic sectional view of the optical semiconductor device according to the present embodiment, which shows a structure thereof. FIG. 2 is a perspective view of the optical semiconductor device according to the present embodiment, which shows a structure thereof. FIGS. 3 and 4 are perspective views of examples of the optical semiconductor device according to the present embodiment, which show the structures thereof. FIG. 5A-5C, 6A-6B, and 7A-7B are sectional views of the optical semiconductor device according to the present embodiment in the steps of the method for fabricating the same, which show the method.

First, the structure of the optical semiconductor device according to the present embodiment will be explained with reference to FIGS. 1 and 2. FIG. 2 is a perspective view of the optical semiconductor device according to the present embodiment with a part of the mesa stripe removed so as to understandably illustrate the structure of the active layer of the optical semiconductor device.

An SCH (Separate Confinement Hetero-structure) layer 12 of InAlGaAs is formed on an InP substrate 10. An active layer 28 is formed on the SCH layer 12. The active layer 28 includes quantum dot stacks 18, 22, 26 each formed of a stack of a plurality of quantum dot layers 14 each having a plurality of InAs quantum dots and a plurality of barrier layers 16 of InAlGaAs which are stacked the latter on the former, and barrier layers 20, 24 which are formed between each of the quantum dot stacks 18, 22, 26. A SCH layer 30 of InAlGaAs is formed on the active layer 28. A clad layer 32 of p-InP and a contact layer 34 of p-InGaAs are formed on the SCH layer 30. The clad layer 32 and the contact layer 34 are patterned in a mesa-configuration. A p-side electrode 42 is formed on the contact layer 34, which is on the top of the mesa with a silicon oxide film 38 formed therebetween. An n-side electrode 44 is formed on the backside of the InP substrate 10.

Figure 9:
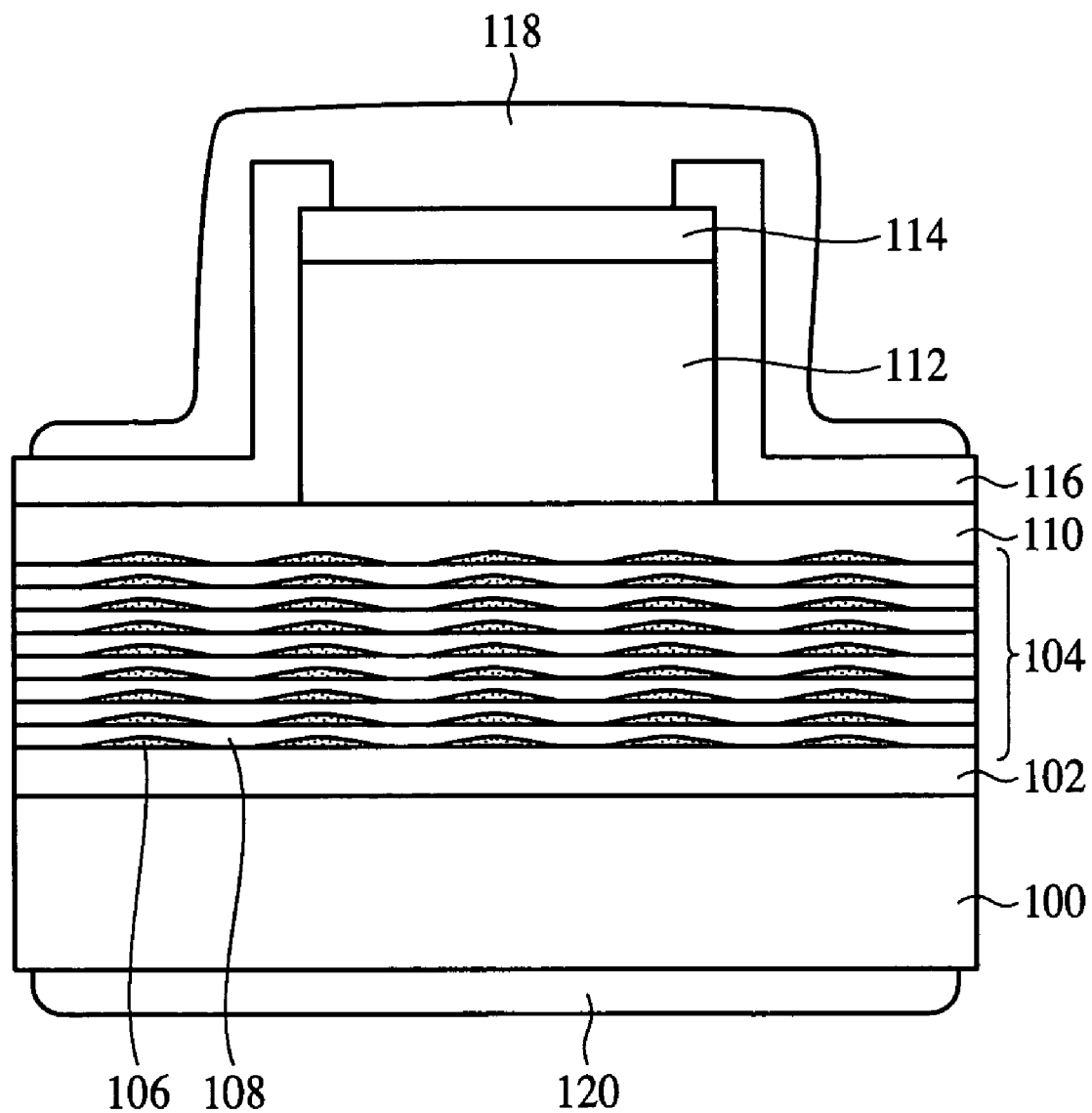
FIG. 9 is a diagrammatic sectional view of the conventional optical semiconductor device, which shows the structure thereof.

The optical semiconductor device according to the present embodiment is the same as the conventional optical semiconductor device shown in FIG. 9 in that the active layer 28 is formed of a stack of a plurality of quantum dot layers. The optical semiconductor device according to the present embodiment is characterized mainly in that the active layer 28 includes a plurality of quantum dot stacks 18, 22, 26 each formed of a stack of a plurality of quantum dot layers 14 and a plurality of barrier layers 16 of a first film thickness repeatedly stacked the latter on the former, and said the plurality of quantum dot stacks 18, 22, 26 are stacked one on another with the barrier layers 20, 24 of a second film thickness larger than the first film thickness interposed therebetween.

In a optical semiconductor device using a quantum dot active layer, for the prevention of the interaction between the quantum dots adjacent to each other layer-thickness wise and for the increase of the light confinement coefficient, the film thickness of the barrier layers formed between the quantum dot layers must be defined. That is, when the film thickness of a barrier layer formed between quantum dot layers is too thin, the wave functions between the quantum dot layers overlap each other, the quantum dot layers fail to function as the discrete quantum dot layers. When the film thickness of the barrier layer formed between the quantum dot layers is too thick, the light confinement coefficient is low, which degrades the characteristics of the optical semiconductor device. The light confinement coefficient is a ratio of light energy confined in the active layer of the device, and generally the larger light confinement coefficient is advantageous in the characteristics.

For further improvement of the characteristics, when a plurality of quantum dot layers are stacked one on another with the barrier layers which satisfy such conditions interposed therebetween, dislocations due to lattice mismatching between the substrate and the quantum dots as a number of the quantum dot layers is increased take place, which degrades the characteristics of the optical semiconductor device.

Then, in the optical semiconductor device according to the present embodiment, the active layer 28 is formed as follows.

First, the active layer 28 is formed of a plurality of quantum dot stacks 18, 22, 26 each having a plurality of quantum dot layers 14 and a plurality of barrier layers 16 of a first film thickness repeatedly stacked the latter on the former. The film thickness of the barrier layers 16 (the first film thickness) is a film thickness optimized in view of the prevention of the interactions between the quantum dots and the increase of the light confinement coefficient. The lower limit value of the film thickness of the barrier layers 16 is defined in view of the prevention of the interaction between the quantum dot layers 14 and must be set at not less than about 5 nm. The upper limit value of the film thickness of the barrier layers 16 is determined by the light confinement coefficient and is preferably set suitably in accordance with a device structure. For the material group of the optical semiconductor device according to the present embodiment, it is preferable that the film thickness of the barrier layers 16 is set at not more than about 30 nm.

For the quantum dot stacks 18, 22, 26, the film thickness of the barrier layers 16 and the layer number of the quantum dot layers 14 are set suitably to be below a critical film thickness which dislocations due to lattice mismatching between the substrate and the quantum dots take place. For the material group of the optical semiconductor device according to the present embodiment, when the barrier layers 16 are 15 nm, a layer number of the quantum dot layers 14 can be 3 layers.

The quantum dot stacks 18, 22, 26 are stacked one on another with the barrier layers 20, 24 of a second film thickness interposed therebetween. The barrier layers 20, 24 have the original function of barrier layers and function to mitigate strains due to lattice mismatching generated in the quantum dot stacks 18, 22. Accordingly, the film thickness of the barrier layers 18, 22 (the second film thickness) is a film thickness required to mitigate at least the lattice strains. For the material group of the optical semiconductor device according to the present embodiment, the lower limit of the film thickness of the barrier layers 20, 24 is about 15 nm. The upper value of the film thickness of the barrier layers 20, 24 is determined by the light confinement coefficient, as is that of the barrier layers 16 and is preferably set in accordance with a structure of the device.

In the optical semiconductor device according to the embodiment shown in FIG. 1, when the film thickness of the barrier layers 16 was 15 nm, the quantum dot stacks 18, 22, 26 were each formed of 3 quantum dot layers, and the film thickness of the barrier layers 20, 24 was set to be 65 nm or less, the light confinement coefficient could be larger than the light confinement coefficient of the conventional optical semiconductor device shown in FIG. 9, in which the film thickness of the barrier layers 108 was 30 nm, and 9 quantum dot layers 106 were stacked.

The active layer 28 is thus formed, whereby the light confinement coefficient can be optimized, the generation of dislocations due to lattice mismatching between the substrate and the quantum dots is suppressed, and the number of the quantum dot layers can be easily increased.

FIG. 3 is a perspective view of one example of the application of the optical semiconductor device according to the present embodiment to SOA. In the SOA shown in FIG. 3, while prescribed drive current is being injected from the electrode 42, input light is incident on one end surface of the SOA, and amplified output light can be obtained from the other end surface. The present invention is applied to the active layer of such the SOA, whereby the SOA can have the active layer which has high gains and is pattern-effect free. This SOA is applied to a wavelength conversion device, whereby the wavelength conversion device can cover all the C-band.

FIG. 4 is a perspective view of one example of the application of the optical semiconductor device according to the present embodiment to a semiconductor laser. In the semiconductor laser shown in FIG. 4, prescribed drive current higher than the oscillation threshold value is injected from the electrode 42, whereby the laser oscillates and can output laser beam. A merit of quantum dots in semiconductor lasers is the a parameter is near zero. Thus, a semiconductor laser whose chirp is very small even when modulated at a high speed of about 40 GHz can be realized. Accordingly, the semiconductor laser can reduce costs of fast modulation light sources in comparison with combinations of CW laser light source and an outside modulator, and modulator integrated light sources.

As shown in FIGS. 3 and 4, the SOA and the semiconductor laser are the same in the basic structure but are different from each other in that in the SOA the end surfaces are processed for anti-reflection, while in the semiconductor laser, the end surfaces are processed for high reflection so as to form a resonator. The anti-reflection processing can be forming an anti-reflection film on the end surfaces. The high reflection processing can be forming a film of a prescribed reflectance on the end surfaces or forming the end surfaces by cleavage.

The optical semiconductor device according to the present embodiment, which has a waveguide structure of p-i-n junction including the active layer, is applicable not only to SOAs and semiconductor lasers, but also light receiving devices.

Then, the method for fabricating the optical semiconductor device according to the present embodiment will be explained with reference to FIGS. 5A-5C, 6A-6B, and 7A-7B.

First, the SCH layer 12 of, e.g., a 42 nm-thick InAlGaAs is formed on the (311) oriented n-InP substrate 10 of, e.g., a $2 \times 10^{18}$ cm$^{-3}$ impurity concentration by, e.g., MBE method or MOVPE method.

An n-type lower clad layer may be formed between the InP substrate 10 and the SCH layer 12. In the optical semiconductor device according to the present embodiment, the InP substrate 10 also functions as the lower clad layer.

Then, InAs of, e.g., an about 2.5 atomic layers is grown on the SCH layer 12 by, e.g., MBE method or MOVPE method. This InAs is self-assembled with quantum dots of three-dimensional grown islands due to lattice mismatching with the InP substrate. Thus, the quantum dot layer 14 of InAs is formed on the SCH layer 12.

Next, the barrier layer 16 of, e.g., a 15 nm-thick InAlGaAs is formed by, e.g., MBE method or MOVPE method on the SCH layer 12 with the quantum dot layer 14 formed on.

Figure 5A:
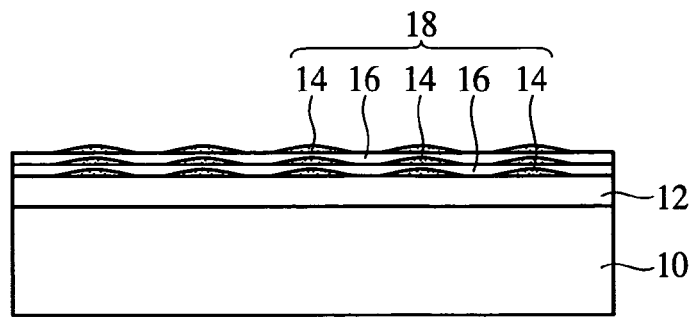
FIGS. 5A-5C, 6A-6B, and 7A-7B are sectional views of the optical semiconductor device according to the embodiment of the present invention in the steps of the method for fabricating the same, which show the method.

Next, in the same way as the above-described quantum dot layer 14 and the barrier layer 16 has been formed, the formation of the quantum dots and the InAlGaAs layer is repeated to thereby form the quantum dot stack 18 having 3 quantum dot layers 14 with the barrier layers 16 interposed therebetween (FIG. 5A).

Then, the barrier layer 20 of, e.g., a 30 nm-thick InAlGaAs is formed on the quantum dot stack 18 by, e.g., MBE method or MOVPE method.

Next, in the same way as the quantum dot stack 18 has been formed, 3 quantum dot layers are stacked one on another with the InAlGaAs layers interposed therebetween to form the quantum dot stack 22 on the barrier layer 20.

Then, the barrier layer 24 of, e.g., a 30 nm-thick InAlGaAs is formed on the quantum dot stack 22 by, e.g., MBE method or MOVPE method.

Then, in the same way as the quantum dot stack 18 has been formed, 3 quantum dot layers are stacked one on another with the InAlGaAs layers interposed therebetween to form the quantum dot stack 26 on the barrier layer 24.

Thus, the active layer 28 having the quantum dot stacks 18, 22, 26 stacked one on another with the barrier layers 20, 24 interposed therebetween is formed.

Figure 5B:
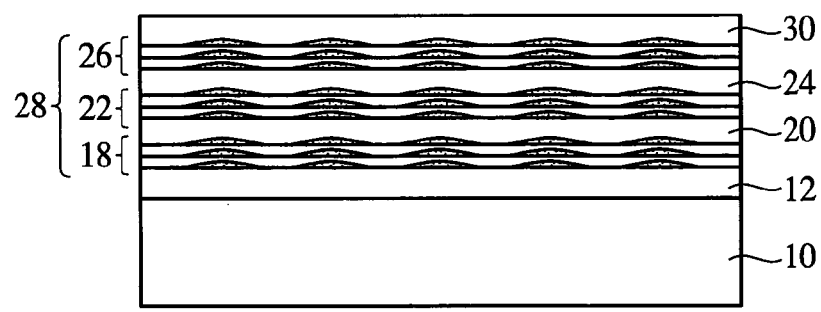

Next, the SCH layer 30 of, e.g., a 42 nm-thick InAlGaAs is formed on the active layer 28 by, e.g., MBE method or MOVPE method (FIG. 5B).

Then, the clad layer 32 of, e.g., a 3000 nm-thick p-InP of a $2 \times 10^{18}$ cm$^{-3}$ impurity concentration is formed on the SCH layer 30 by, e.g., MBE method or MOVPE method.

Figure 5C:
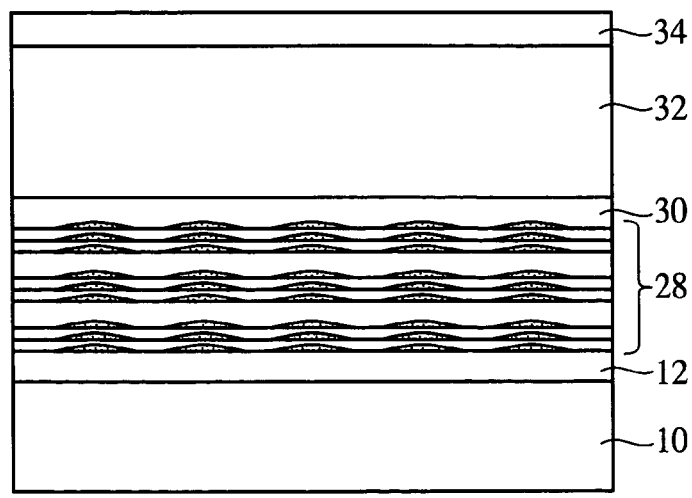

Next, the contact layer 34 of p-InGaAs of, e.g., a $1.5 \times 10^{19}$ cm$^{-3}$ impurity concentration is formed on the clad layer 32 by, e.g., MBE method or MOVPE method (FIG. 5C).

Next, a 400 nm-thick silicon oxide film 36 is deposited on the contact layer 34 by, e.g., CVD method.

Next, the silicon oxide film 36 is patterned by photolithography and wet etching using a hydrofluoric acid-based etching solution into a 4 μm-width stripe.

Figure 6A:
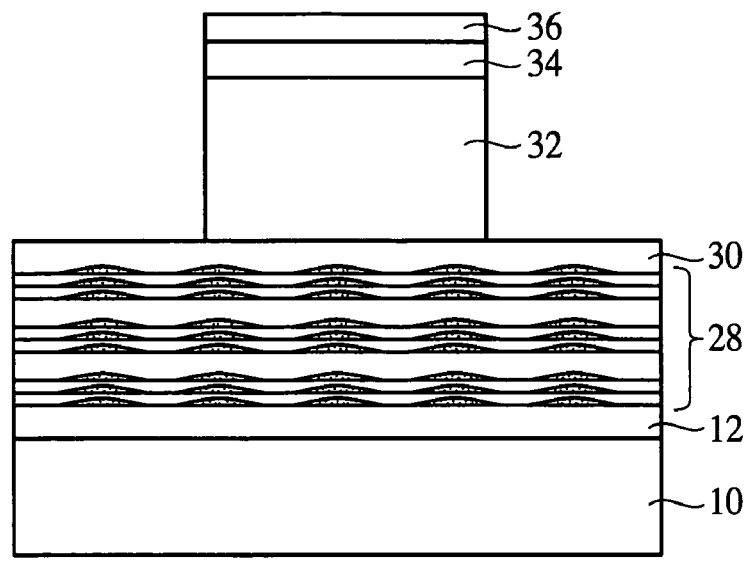

Then, with the silicon oxide film 36 as the mask, the contact layer 34 and the clad layer 32 are anisotropically etched into a mesa-configuration by reactive ion etching using, e.g., SiCl$_4$ plasmas (FIG. 6A).

Next, the silicon oxide film 36 is removed by wet etching using a hydrofluoric acid-based aqueous solution.

Then, the silicon oxide film 38 of, e.g., a 500 nm-thick is formed by, e.g., CVD method.

Figure 6B:
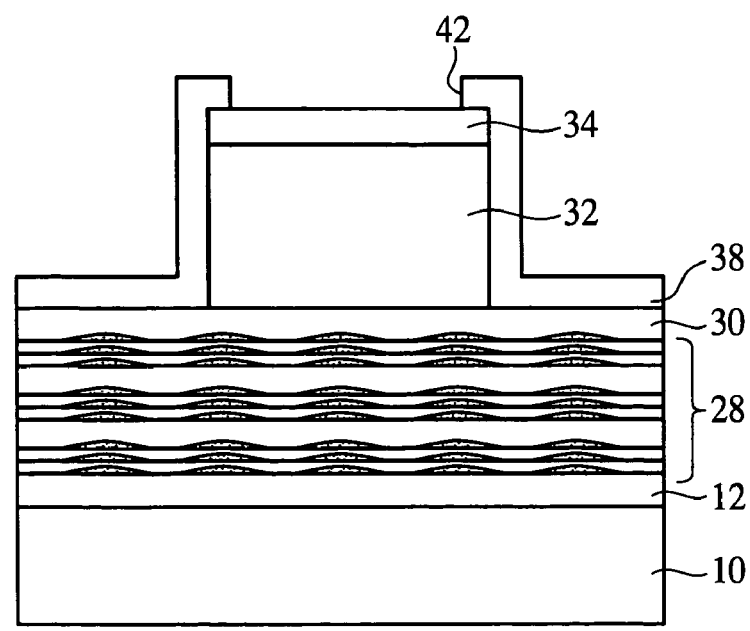

Then, the silicon oxide film 38 is patterned by photolithography and wet etching using a hydrofluoric acid-based etching solution to form a 3 μm-width stripe-shaped opening 40 in the silicon oxide film 38 on the top of the mesa (FIG. 6B).

Next, a titanium (Ti) film of, e.g., a 100 nm-thick and a platinum (Pt) film of, e.g., a 300 nm-thick are deposited by, e.g., electron beam evaporation method.

Next, with the titanium film and the platinum film as the seed, a 3 μm-thick gold (Au) film is deposited on the platinum film by plating.

Figure 7A:
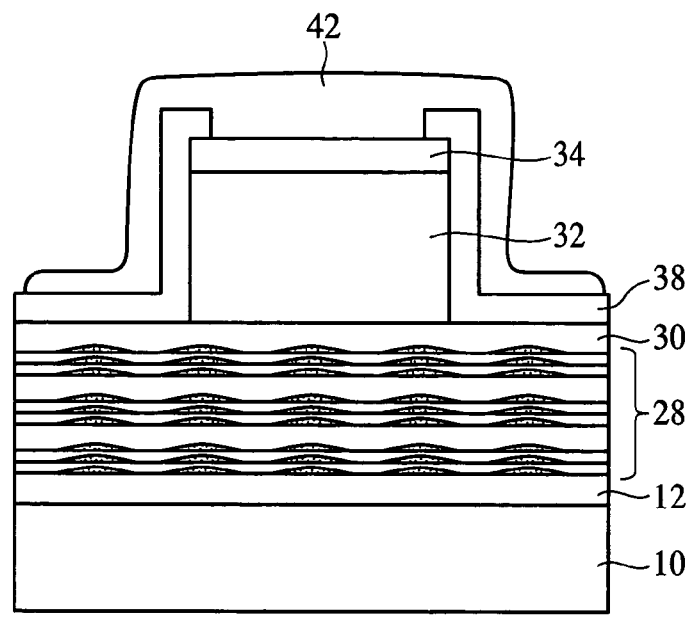

The p-side electrode 42 of the Au/Pt/Ti layer structure and electrically connected to the contact layer 34 via the opening 40 is thus formed (FIG. 7A).

Next, the InP substrate 10 is polished at the backside until the thickness of the InP substrate becomes 150 μm.

Then, a 50 nm-thick AuGe alloy film and a 250 nm-thick gold film are deposited on the backside of the InP substrate 10 by, e.g., resistive heating deposition.

Then, with the AuGe alloy film and the gold film as the seed, a 3 μm-thick gold film is deposited by plating.

Figure 7B:
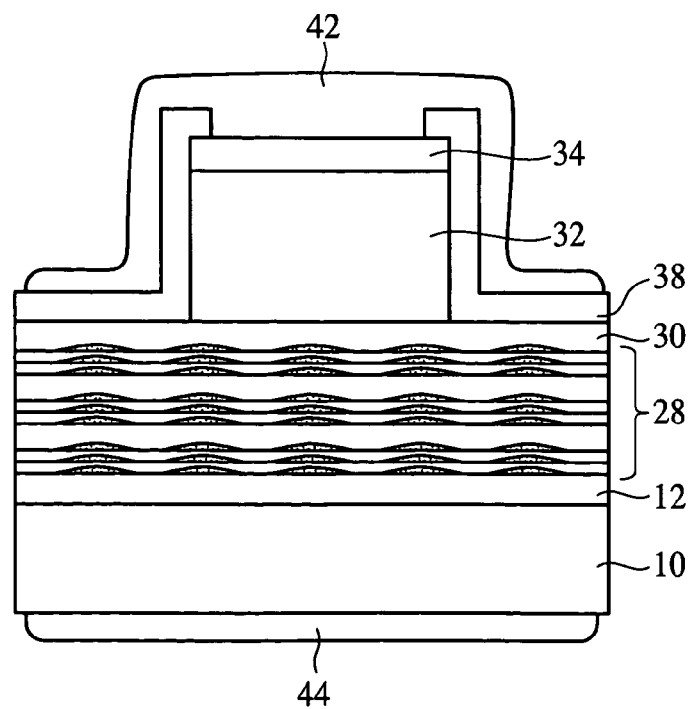

The n-side electrode of the Au/AuGe layer structure and electrically connected to the backside of the InP substrate 10 is thus formed (FIG. 7B).

As described above, according to the present embodiment, a plurality of quantum dot stacks each including a plurality of quantum dot layers 14 and a plurality of barrier layers of a first film thickness repeatedly stacked latter on the former are stacked one on another with the second barrier layers of a second film thickness thicker than the first film thickness interposed therebetween to form the active layer, whereby the quantum dot layers can be stacked with the generation of dislocations due to lattice mismatching between the substrate and the quantum dots suppressed. Thus, losses of the optical semiconductor device due to the dislocations can be prevented. The quantum dot layers can be stacked in a number of layers with a prescribed light confinement coefficient ensured, whereby the optical semiconductor device can have easily improved characteristics.

MODIFIED EMBODIMENTS

The present invention is not limited to the above-described embodiments and can cover other various modifications.

For example, in the above-described embodiment, the active layer is formed of 3 quantum dot stacks each including 3 quantum dot layers. However, a layer number of the quantum dot layer and a layer number of the quantum dot stack are not limited to those of the above-described embodiment. It is preferable that these parameters are suitably selected in accordance with desired device characteristics, etc.

In the above-described embodiment, the substrate and the clad layer are formed of InP; the quantum dot layers are formed of InAs; and the barrier layer and the SCH layer are formed of InAlGaAs layers. However, materials forming the optical semiconductor device are not limited to those of the above-described embodiment. The present invention is widely applicable to optical semiconductor device including active layers formed of a number of quantum dot layers.

Figure 8:
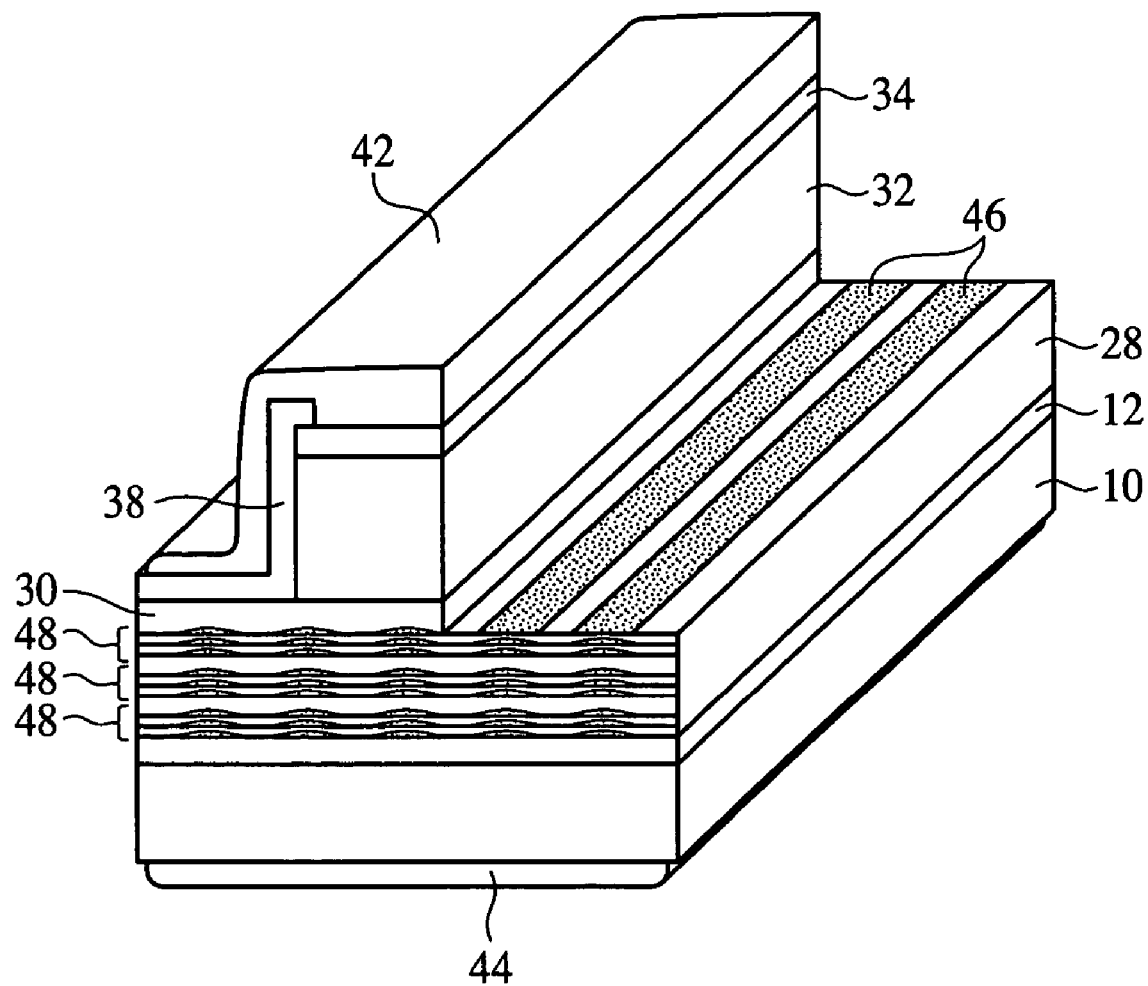
FIG. 8 is a perspective view of the optical semiconductor device according to one modification of the embodiment of the present invention, which shows the structure thereof.

In the above-described embodiment, the active layer 28 is formed of the layer structure of the quantum dot layers, but, as exemplified in FIG. 8, may be formed of quantum wires 46 in place of the quantum dots. That is, it is possible that the active layer 28 is formed of a plurality of quantum wire stacks 48 each including a plurality of quantum wires 46 and a plurality of the first barrier layers (corresponding to the barrier layers 16) repeatedly stacked the latter on the former, which are stacked one on another with the barrier layers (corresponding to the barrier layers 20, 24) thicker than the first barrier layers interposed therebetween. In place of the quantum dots, quantum wells having larger strain magnitudes may be also used. That is, it is possible that the active layer 28 is formed of a plurality of quantum well stacks each including a plurality of quantum wells and a plurality of first barrier layers (corresponding to the barrier layers 16) repeatedly stacked the latter on the former, which are stacked one on another with the second barrier layers (corresponding to the barrier layers 20, 24) thicker than the first barrier layers interposed therebetween.

What is claimed is:

1. An optical semiconductor device comprising:
    a first clad layer of a first conduction type;
    an active layer fanned over the first clad layer, including a plurality of quantum dot stacks each of which is formed of a plurality of quantum dot layers and a plurality of first barrier layers alternately stacked, and a plurality of second barrier layers thicker than the first barrier layers stacked alternately with the quantum dot stacks; and
    a second clad layer of a second conduction-type formed over the active layer,
    the quantum clot layer being lattice mismatched with the first barrier layer,
    a film thickness of the first barrier layer being above a film thickness required to prevent an interaction between the quantum dot layers,
    a film thickness of the second barrier layer being above a film thickness required to mitigate a lattice strain due to a lattice mismatching between the first barrier layer and the quantum dot layer,
    all of the quantum dot layers of all of the plurality of quantum dot sacks having the same composition.

2. An optical semiconductor device according to claim 1, wherein a thickness of the quantum dot stacks is below a critical film thickness which a dislocation due to a lattice mismatching between the first barrier layer and the quantum dot layer takes place.

3. An optical semiconductor device according to claim 1, wherein upper limit film thicknesses of the first barrier layer and the second barrier layer are controlled in accordance with a desired light confinement coefficient.

4. An optical semiconductor device according to claim 1, wherein a film thickness of the first barrier layer is 5-30 nm.

5. An optical semiconductor device according to claim 1, wherein a film thickness of the second barrier layer is 15-65 nm.

6. An optical semiconductor device according to claim 1, further comprising: a first SCH layer formed between the first clad layer and the active layer; and a second SCH layer formed between the active layer and the second clad layer.

7. An optical semiconductor device according to claim 1, wherein the end surfaces of the active layer are processed for anti-reflection.

8. An optical semiconductor device according to claim 1, wherein the end surfaces of the active layer is processed for high reflection.

9. An optical semiconductor device comprising:
a first clad layer of a first conduction type;
an active layer formed over the first clad layer, including a plurality of quantum wire stacks each of which is formed of a plurality of quantum wires and a plurality of first barrier layers alternately stacked, and a plurality of second barrier layers thicker than the first barrier layers stacked alternately with the quantum wire stacks; and
a second clad layer of a second conduction-type formed over the active layer,
the quantum wire being lattice mismatched with the first barrier layer,
a film thickness of the first barrier layer being above a film thickness required to prevent an interaction between the quantum wires,
a film thickness of the second barrier layer being above a film thickness required to mitigate a lattice strain due to a lattice mismatching between the first barrier layer and the quantum wire,
all of the quantum dot wires of all of the plurality of quantum wire stacks having the same composition.

10. An optical semiconductor device comprising:
a first clad layer of a first conduction type;
an active layer formed over the first clad layer, including a plurality of quantum well stacks each of which is formed of a plurality of quantum well layers and a plurality of first barrier layers alternately stacked, and a plurality of second barrier layers thicker than the first barrier layers stacked alternately with the quantum well stacks; and
a second clad layer of a second conduction-type formed over the active layer,
the quantum well layer being lattice mismatched with the first barrier layer,
a film thickness of the first barrier layer being above a film thickness required to prevent an interaction between the quantum wells,
a film thickness of the second barrier layer being above a film thickness required to mitigate a lattice strain due to a lattice mismatching between the first barrier layer and the quantum well layer,
all of the quantum well layers of all of the plurality of quantum well stacks having the same composition.

* * * * *